United States Patent
Ho et al.

[11] Patent Number: 6,156,079
[45] Date of Patent: Dec. 5, 2000

[54] WINDOW SUPPORT MEMBER FOR A SEMICONDUCTOR PROCESSING SYSTEM

[76] Inventors: Henry Ho, 6906 Lenwood Way, San Jose, Calif. 95120; Yu Chang, 1493 Fields Dr., San Jose, Calif. 95219; Kuo-Chun Wu, 3500 Granada Ave., Santa Clara, Calif. 95051; Steven A. Chen, 43241 Livermore Common, Fremont, Calif. 94539

[21] Appl. No.: 09/176,648

[22] Filed: Oct. 21, 1998

[51] Int. Cl.[7] .......................... H01L 21/00; H01L 21/64; C23C 16/00; F27D 11/00; F26B 19/00

[52] U.S. Cl. .................. 29/25.01; 118/725; 219/411; 392/416; 392/418

[58] Field of Search ................... 29/25.01; 118/725; 219/411; 392/416, 418

[56] References Cited

U.S. PATENT DOCUMENTS

| | | | |
|---|---|---|---|
| 5,155,336 | 10/1992 | Gronet et al. | 219/411 |
| 5,660,472 | 8/1997 | Peuse et al. | 374/128 |
| 5,830,277 | 11/1998 | Johnsgard et al. | |
| 5,938,850 | 8/1999 | Arami et al. | |
| 5,986,208 | 11/1999 | Taylor et al. | |
| 6,054,103 | 4/2000 | Collins et al. | |

*Primary Examiner*—David E. Graybill
*Attorney, Agent, or Firm*—Fish & Richardson

[57] ABSTRACT

A semiconductor processing system includes a semiconductor processing chamber constructed of a main body, a window support member, and a window. The window support member is located over an opening into the main body. The window is located over the window support component. At least one radiation passage is formed in the window support component. The radiation passage has a first end which is open to the internal dimensions of the main body and a second end, opposing the first end, which terminates against the window.

22 Claims, 5 Drawing Sheets

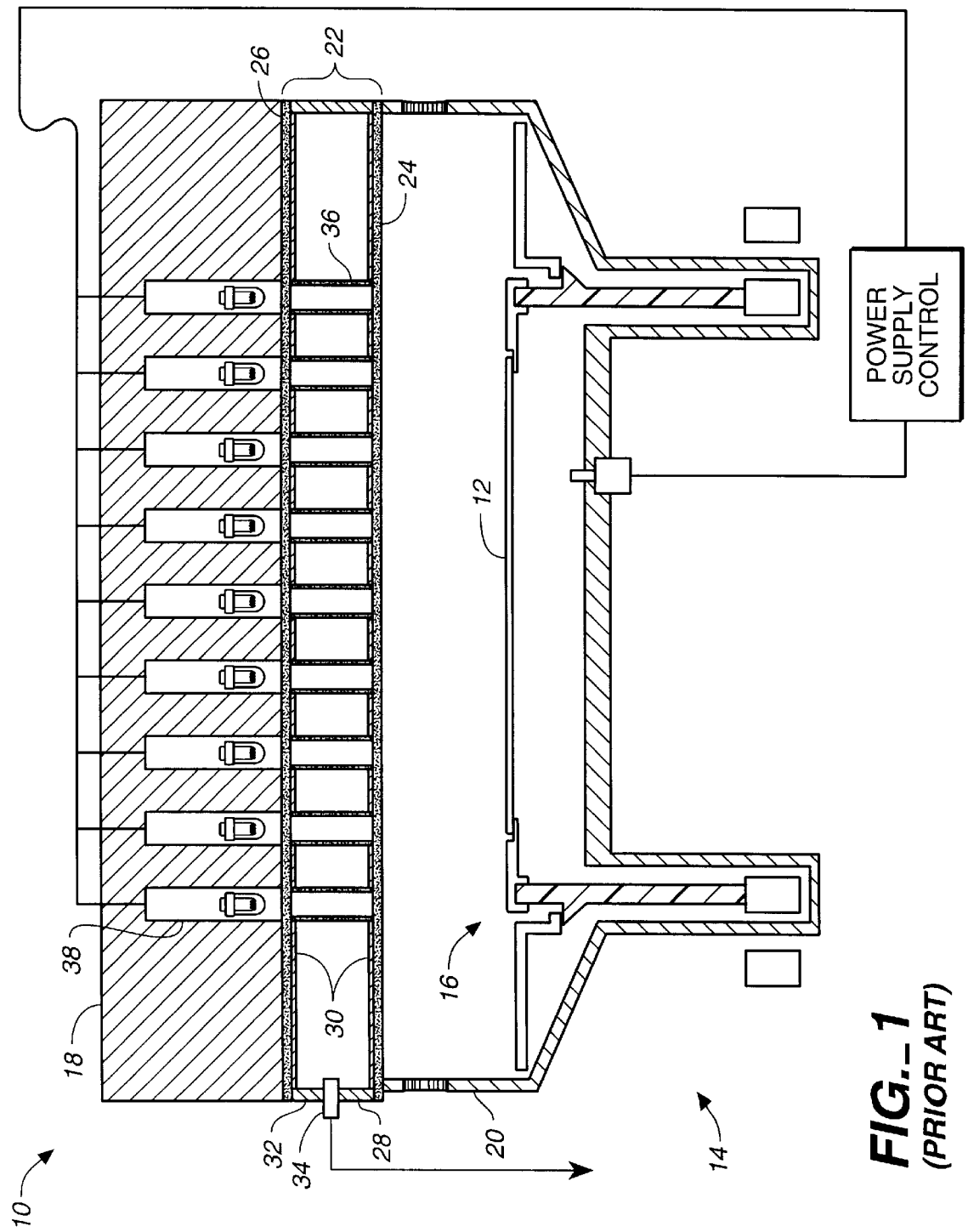
FIG._1 (PRIOR ART)

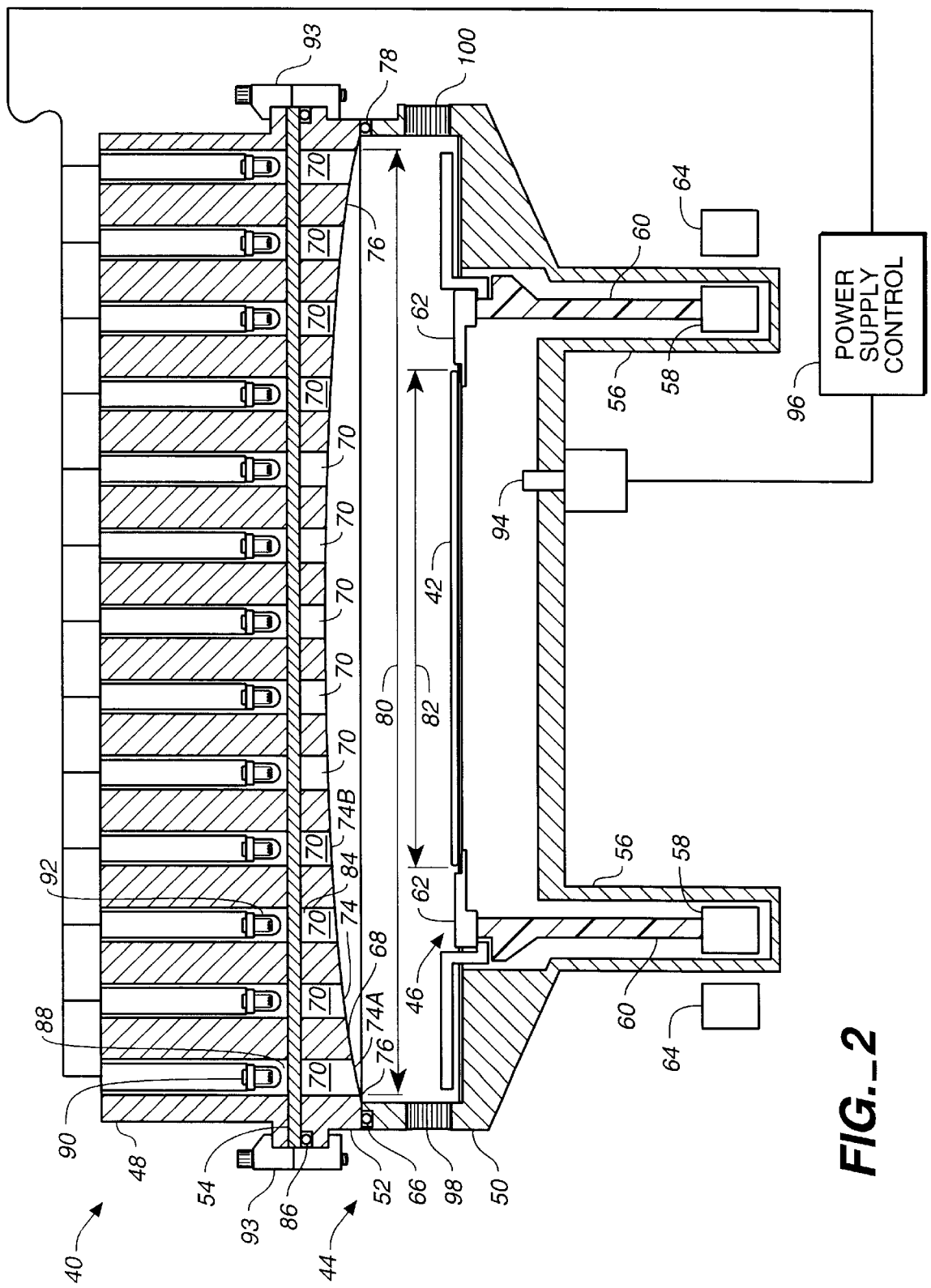
FIG._2

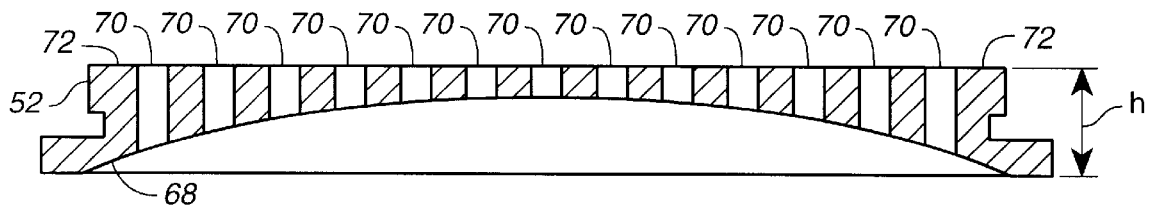
FIG._3
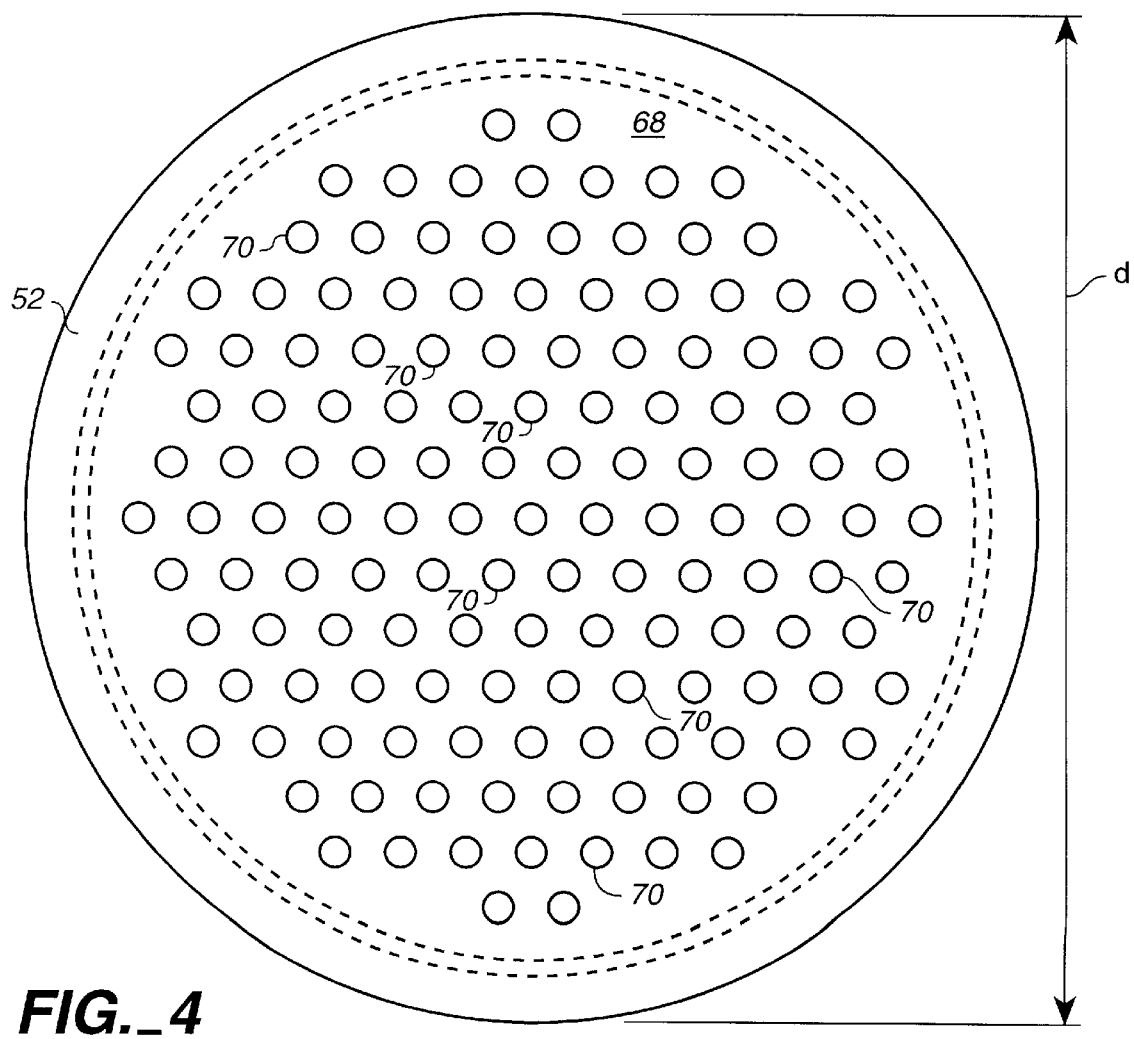
FIG._4

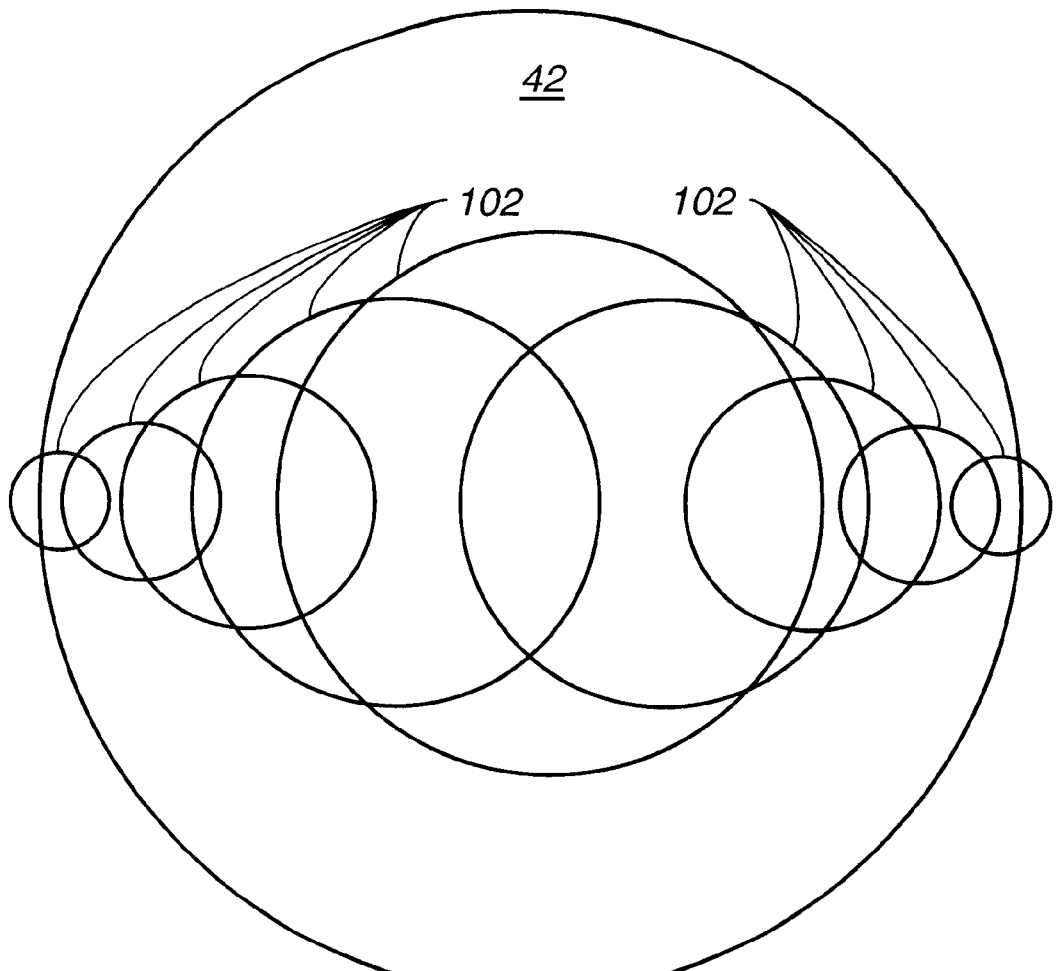
FIG._5

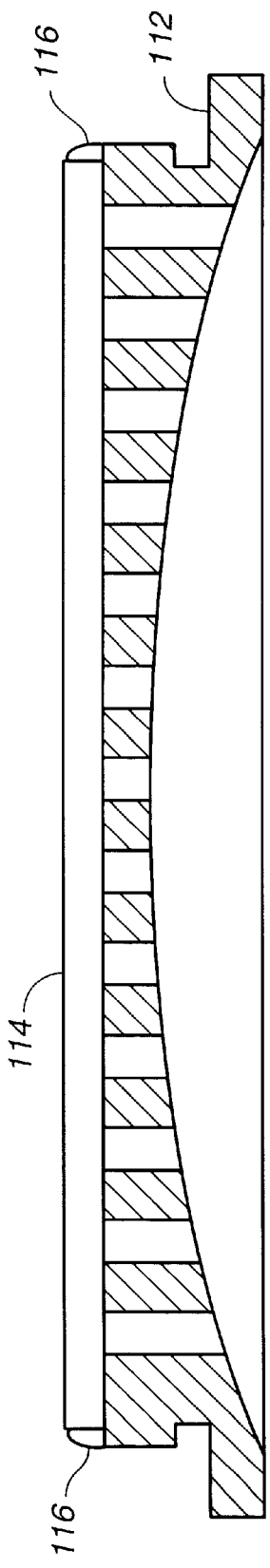
FIG._6
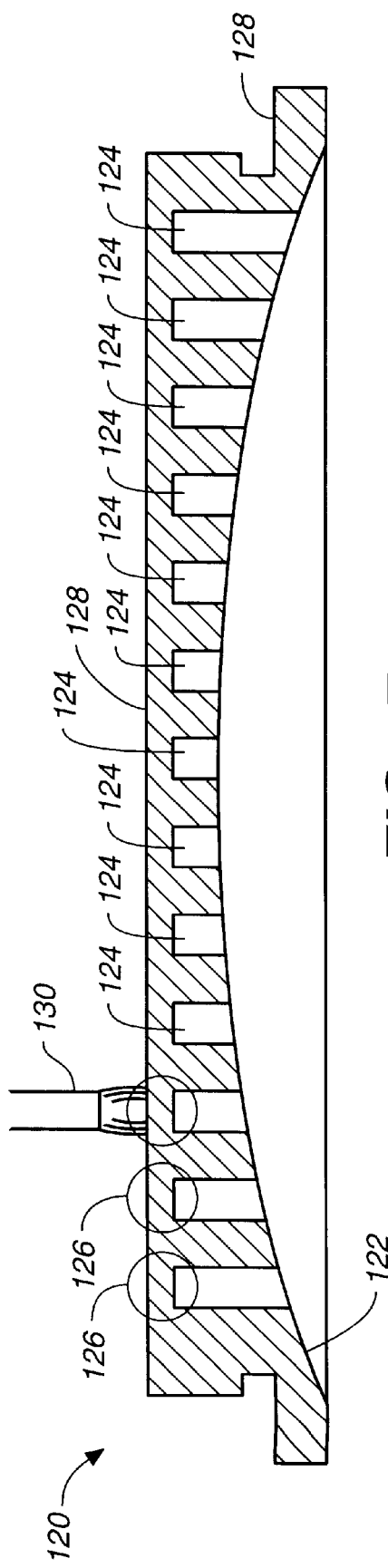
FIG._7

6,156,079

WINDOW SUPPORT MEMBER FOR A SEMICONDUCTOR PROCESSING SYSTEM

BACKGROUND OF THE INVENTION

1). Field of the Invention

This invention relates generally to a semiconductor processing system and, more specifically, to a semiconductor processing system having a semiconductor processing chamber with an infrared light transmitting wall.

2). Discussion of Related Art

FIG. 1 of the accompanying drawings illustrates a conventional semiconductor processing system 10 which is used for subatmospheric pressure processing of a wafer 12. The semiconductor processing system 10 includes a semiconductor processing chamber 14, wafer handling apparatus 16 within the semiconductor processing chamber 14, and a lamp head 18 on the semiconductor processing chamber 14.

The semiconductor processing chamber 14 includes a lower main body 20 and an upper wall 22 comprising a lower quartz window 24, an upper quartz window 26, and a strengthening component 28 which is sandwiched between the lower and upper windows 24 and 26.

The strengthening component 28 is made of stainless steel and comprises two spaced plates 30 and a surrounding ring 32 which jointly define an enclosed volume. A port 34 extends through the ring 32 and may be connected to a pump which is operable to reduce the pressure within the enclosed volume defined by the plates 30 and the ring 32. A plurality of tubes 36 are welded into through holes and in plates 30.

The lower window 24 is made of quartz and protects the internal dimensions of the semiconductor processing chamber 14 against contamination from the material of the strengthening component 28.

A number of infrared lamps 38 are located in the lamp head 18. During processing, infrared radiation from lamps 38 radiate through the upper window 26, tubes 36 and the lower window 24 onto the wafer 12. In this manner, the wafer 12 is heated to a required processing temperature.

During processing, the pressure within the semiconductor processing chamber 14 is maintained at a subatmospheric pressure. The reduced pressure within the semiconductor processing chamber 14 results in a negative pressure on the lower surface of the lower window 24. The pressure within the enclosed volume defined by the plates 30 and the ring 32 is reduced to a pressure which is lower than the pressure within the semiconductor processing chamber 14 in order to prevent collapse of the lower window 24 and the lower of the plates 30 into the semiconductor processing chamber 14.

A processing gas is then introduced into the semiconductor processing chamber 14 for purposes of processing the wafer 12. This gas usually forms a contaminant layer on an inner surface of the semiconductor processing chamber 14, including on the lower window 24, and on the wafer handling apparatus 16. The contaminant layer eventually forms to a thickness on the lower window 24 which prevents infrared light from suitably reaching the wafer 12.

SUMMARY OF THE INVENTION

In general, the invention features a semiconductor processing system. It includes a main body that at least partially defines a processing chamber, a window support member, and a window. The window support member is located over an opening into the main body and has at least one through passage with a first end that is open to the internal dimensions of the main body. The window is located over the window support member. The through passage of the window member has a second end, oppsing the first end, which terminates against the window.

Implementations of the invention may include the following features. The window support member may have a surface facing into the main body wherein the surface has an inwardly dome shape. The window support member may rest on the main body and the dome shape may terminate on the main body. The window support member may be opaque or translucent to infrared radiation. The window support member may be made of opaque silica quartz or clear fused quartz. The window may be formed integral with the window support member. A heat source may be positioned to direct heat through the window into the passage in the window support member. A plurality of passages covering a first area over a first diameter may be formed in the window support member. A susceptor may be provided for supporting a wafer of a second diameter in the processing chamber wherein the first diameter is larger than the second diameter. The first diameter may be between about 10% and 30% greater than the second diameter.

In general, in another aspect, the invention is directed to a window for a semiconductor processing chamber. The window includes a body having opposing first and second surfaces. The body includes a first portion and a second portion, the first portion being substantially opaque to infrared radiation. The window further includes a plurality of passages extending partially into the body. Each of the passages may have aproximal end terminating at the second surface and a distal end terminating within the body. The second portion of the body may be defined by the area between the first surface and the distal end of the passages. The first portion may be translucent infrared radiation.

Other embodiments of the window may include the feature wherein the first portion is made of quartz.

Among the advantages of the invention is that the window support member is strengthened for purposes of low pressure processing.

Other features and advantages of the invention will be apparent from the following detailed description and from the claims.

DESCRIPTION OF THE DRAWING

The invention is further described by way of examples with reference to the accompanying drawings wherein:

FIG. 1 is a sectioned side view of a prior art semiconductor processing system;

FIG. 2 is a sectioned side view of a semiconductor processing system according to the invention;

FIG. 3 is a sectioned side view of a window support member according to one embodiment of the invention;

FIG. 4 is a bottom view of the window support member of FIG. 3;

FIG. 5 is a plan view which illustrates a number of light patterns on a wafer located within the semiconductor processing system of FIG. 2;

FIG. 6 is a sectioned side view of a window support member according to another embodiment of the invention; and FIG. 7 is a sectioned side view of a window support member according to a further embodiment of the invention.

DETAILED DESCRIPTION OF THE INVENTION

A semiconductor processing system and a support member for a window of a semiconductor processing chamber are described. In the following description, numerous specific details are set forth in order to provide a thorough understanding of the invention. It will be appreciated, however, by one skilled in the art that the invention may be practiced without these specific details. In other instances, well-known elements have not been shown in order to avoid unnecessarily obscuring the invention.

A semiconductor processing system is disclosed having a semiconductor processing chamber constructed of a lower main body and an upper wall. The upper wall comprises a window support member made of quartz and a window over the window support member. Through passages, or radiation passages, are formed through the support member. First ends of the radiation passages are open to the internal dimensions of the chamber and second ends of the radiation passages terminate against the window. Because the first ends of the radiation passages are open to the internal dimensions of the chamber, no contaminant layer forms over the first ends during processing. Infrared light, used for heating a wafer within the chamber, can therefore pass unobstructed through the first ends into the chamber. Moreover, the dimensions of the radiation passages are such that minimal gas reaches the window to cause a contaminant layer on the window.

FIG. 2 of the accompanying drawings illustrates a cross-sectional view of a semiconductor processing system 40 in accordance with one embodiment of the invention. The semiconductor processing system 40 includes a semiconductor processing chamber 44, wafer handling apparatus 46 located within the semiconductor processing chamber 44, and a lamp head 48 located on the semiconductor processing chamber 44.

The semiconductor processing chamber 44 is constructed of three primary components including a lower main body 50, a window support member 52 resting on the main body 50, and a window 54 located on the window support member 52. The support member 52 is generally made of a material that is opaque to infrared light whereas window 54 is made of a material that is transparent to infrared light. In one embodiment, support member 52 and window 54 are made of opaque silica quartz and clear fused silica quartz, respectively. Quartz is selected for the window support member 52 because it can be cleaned with a medium such as chlorine which is used for cleaning the other components of the semiconductor processing chamber 44.

The main body 50 is made of stainless steel with a quartz inner liner (not shown). A circular channel 56 forms part of a base of the main body 50.

The wafer handling apparatus 46 includes a magnetic rotor 58 within channel 56, a quartz tubular support 60 resting on or otherwise coupled to the magnetic rotor 58, and a silicon carbide coated graphite susceptor 62 resting on the tubular support. During processing, a wafer 42 rests on the susceptor 62.

A magnetic stator 64 is located externally of the channel 56 and is used to magnetically induce rotation of the magnetic rotor 58 through the main body 50. Rotation of the magnetic rotor 58 causes rotation of the susceptor 62.

The window support member 52 rests on an upper edge of the main body 50. An o-ring 66 is located between the window support member 52 and the main body 50 to provide an air-tight seal at the interface.

FIG. 3 is a sectional side view of the window support member 52 shown in FIG. 2. FIG. 4 is a bottom view of the window support member 52. The window support member 52 has a body with a lower convex surface 68 having an inwardly domed shape. In one embodiment, for processing a 200 millimeter (mm) wafer, the height (h) of the window support member is between about three quarters of an inch and one inch, the diameter (d) of the window support member is about 15 inches, and lower surface 68 has a radius of curvature of approximately 93 cm. A plurality of through passages 70 extend from the lower surface 68 through the window support member 52 and through an upper surface 72 of the window support member 52. Each of through passages 70 has a diameter of approximately 1.5 to 1.6 inches. The length or depth of the through passages 70 vary from about 0.86 cm at the center most through passage, to about 3.17 cm at the outermost through passages.

Referring again to FIG. 2, each of through passages 70 has a lower end which is open to the internal dimensions of the semiconductor processing chamber 44. The domed lower surface 68 faces into the main body 50 and has an edge 76 which meets with an inner edge 78 of the main body 50. The dome shape of the lower surface 68 therefore terminates on the main body 50.

In one embodiment the through passages 70 are formed over an area having a diameter 80 which is generally between 10% and 30% greater than the diameter 82 of the wafer 42.

The window 54 covers an upper end 84, opposing the lower end 74, of each through passage 70. An o-ring 86 is located between the window 54 and the window support member 52 to provide an air-tight seal at the interface.

The lamp head 48 may be made of any suitable material such as stainless steel and is formed with a plurality of openings 88. Each of openings 88 contain heating lamps 92 that are supported by electrical sockets 90. In one embodiment, lamps 92 are infrared radiation emitting light bulbs.

Each of openings 88 in lamp head 48 is located over a respective through passage 70 in window support member 52. Heat radiating from lamps 92 is transmitted to wafer 42 through openings 88, window 54 and through passages 70.

Clamps 93 secure the window support slab 52, the window 54 and the lamp head 48 to one another.

One or more pyrometers 94 are located in a lower wall of the main body 50 and are positioned to detect a temperature on a lower surface of the wafer 42. Each pyrometer 94 is connected to a power supply control 96 which controls the power supplied to each of the infrared light bulbs 92 in response to the measured temperature.

The main body 50 of the processing chamber 44 includes a processing gas inlet port 98 and a gas outlet port 100. In use, the pressure within the semiconductor processing chamber 44 is reduced to a subatmospheric pressure prior to introducing a process gas through inlet port 98. The pressure is typically reduced to between 1 torr and 160 torr.

As previously discussed, a window support member 52 is typically made of quartz. Quartz has a high compressive strength, but a relatively low tensile strength. By manufacturing the window support member 52 to have an inwardly domed lower surface 68, the quartz within the surface 68 is placed under compressive stress when the pressure within the semiconductor processing chamber 44 is reduced. Since the domed shape extends all the way onto the main body 50, the entire lower surface 68 is placed under compressive stress.

Heat transfer away from the wafer 42 is greatest along the outer edges of the wafer. There is, therefore, a tendency for a temperature gradient to be created over the wafer with an edge of the wafer being at a lower temperature than a central portion of the wafer 42. In accordance with one aspect of the present invention, the window support member 52 is constructed such that the lower ends 74A of the outer through passages 70 are located nearer susceptor 62 than the lower ends 74B of the central through passages 70. Accordingly, infrared light radiating through the outer radiation passages create smaller and more concentrated radiation patterns on the wafer 42 than the infrared light radiating through the inner radiation passages. FIG. 5 shows the wafer 42 with a number of radiation circles 102 representing infrared light radiating from central, outer and intermediate radiation passages. It can be seen that the larger, less concentrated radiation patterns are formed on a central area of the wafer 42, whereas smaller, more concentrated radiation patterns are formed at an edge of the wafer 42. The smaller, more concentrated radiation patterns provide more heat at the wafer edge which results in a reduced temperature gradient across the wafer.

Processing of wafer 42 is accomplished by passing a process gas over the heated surfaces of the wafer. During processing, a thin contaminant layer usually forms on the inner surface of the semiconductor processing chamber 44 and on the wafer handling apparatus 46 components. Since the lower ends 74 of the radiation passages 70 comprise voids that are open to the internal dimensions of the semiconductor processing chamber 44, the lower ends 74 remain unobstructed since there exist no surface for the formation of a contamination layer. Heat radiating from lamps 92 is thereby more readily transferable through the radiation passages 70 onto the wafer 42.

A process gas flowing from the inlet port 98 to the outlet port 100 of the process chamber is necessarily separated from window 54 by a distance defined by the depth of passages 70. By providing a separation distance between the process gas flow and the window 54, the build up of a contamination layer on the window 54 is reduced. The geometric and dimensional characteristics of passages 70 may also be selected so as to inhibit the flow of the process gas into passages 70.

A salient feature of the semiconductor processing system 40 is that the deposition of a contaminant layer onto the radiant heat conduits of the chamber 44 is dramatically reduced during wafer processing. As a result, heat can radiate unobstructed onto the wafer 42 even after the formation of a contaminant layer within the semiconductor processing chamber 44. The wafer 42 can then be processed in a more uniform manner and for longer periods of time without the need for cleaning the quartz window 54.

The window support member 52 may be manufactured by forming a block of quartz and drilling or boring the through passages 70 into the quartz block. There is, therefore, no need for welding or otherwise securing a large number of components to one another in the manufacture of the window support member 52.

FIG. 6 is a sectioned side view of a window support member 112 and a window 114 in another embodiment of the invention. Window 114 is sealed on the window support member 112 by means of a fusion weld 116 about an edge of the window 114 and in circumferential contact with the window support member 112. The need for an o-ring at the window 114 and support slab 116 is therefore eliminated.

FIG. 7 is a sectioned side view illustrating the manufacture of a window member 120 comprising a quartz slab having a plurality of integrally formed windows. The window member 120 is made of quartz which is opaque to infrared radiation and has a lower surface 122 which is inwardly domed. A number of radiation passages 124 are drilled or bored into the lower surface 122 and extend only partially through the component 120. Areas 126 between the respective radiation passages 124 and an upper surface 128 of the window member 120 are then heated by means of a welding torch 130 or other heating means. Heating of the areas 126 causes the opaque quartz within the areas to turn translucent or transmissive to infrared radiation. An infrared transmissive window is so made within each area 126. When the lamp head 48 is located on the window member 120, the heat lamps 92 radiate heat through the windows created in the areas 126 and into the radiation passages 124.

While certain exemplary embodiments have been described and shown in the accompanying drawings, it is to be understood that such embodiments are merely illustrative and not restrictive of the current invention, and that this invention is not restricted to the specific constructions and arrangements shown and described, since modifications may occur to those ordinarily skilled in the art.

What is claimed is:

1. A semiconductor processing system, comprising:
   a main body at least partially defining a processing chamber;
   a window support member, over an opening into the main body having at least one passage formed therein with a first end which is open to the internal dimensions of the chamber; and
   a window over a second end of the passage opposing the first end.

2. The semiconductor processing system of claim 1 wherein the window support member has a surface facing into the main body, the surface having an inwardly dome shape.

3. The semiconductor processing system of claim 2 wherein the window support member rests on the main body, the dome shape terminating on the main body.

4. The semiconductor processing system of claim 1 wherein the window support member is opaque to infrared radiation.

5. The semiconductor processing system of claim 4 wherein the window is substantially translucent to infrared radiation.

6. The semiconductor processing system of claim 1 wherein the window support member is made of opaque silica quartz.

7. The semiconductor processing system of claim 1 wherein the window is made of clear fused quartz.

8. The semiconductor processing system of claim 1 wherein the window is integral with the window support member.

9. The semiconductor processing system of claim 1 which includes a heat source positioned to direct heat through the window into the passage.

10. The semiconductor processing system of claim 1 wherein a plurality of passages covering a first area over a first diameter are formed in the window support member.

11. The semiconductor processing system of claim 10 which includes a susceptor for supporting a wafer of a second diameter, the first diameter being larger than the second diameter.

12. The semiconductor processing system of claim 11 wherein the first diameter is between about 10% and 30% greater than the second diameter.

13. The semiconductor processing system of claim 1 wherein there are a plurality of said passages, the window support member has a surface facing into the main body, the surface having a dome shape, and the plurality of passages having an end terminating at the domed surface.

14. The semiconductor processing system of claim 1 which includes a plurality of said passages and a plurality of heat sources, each heat source positioned to radiate through a respective one of the plurality of passages.

15. The semiconductor processing system of claim 1 wherein the window is sealed to the window support member by a fusion weld about an edge thereof.

16. A semiconductor processing system, comprising:

a main body at least partially defining a processing chamber;

a window support member, over an opening into the main body, having a plurality of radiation passages formed therein, each radiation passage having a first end which is open to the internal dimensions of the chamber;

a window over a second end of each radiation passage opposite the first end; and a lamp head having a plurality of heat sources, each heat source positioned to radiate through a respective radiation passage.

17. A semiconductor processing system, comprising:

a main body at least partially defining a processing chamber;

a window support member over an opening into the main body, the window support member having a dome shaped surface facing into the main body; and a window over the window support member, the window support member having at least one radiation passage through which infrared light, transmitted through the window, travels into the main body.

18. A semiconductor processing chamber window support member, comprising:

a body having opposing first and second surfaces, the first surface configured to support a window, the second surface having an inwardly domed shape; and a plurality of passages extending between the first and second surfaces.

19. The window support member of claim 18 wherein the body is made of a material that is opaque to infrared radiation.

20. The window support member of claim 18 wherein the body is made of opaque silica quartz.

21. A window for a semiconductor processing chamber, comprising:

a body having opposing first and second surfaces, the body including a first portion and a second portion, the first portion being substantially opaque to infrared radiation;

a plurality of passages extending partially into the body, the passages each having a proximal end terminating at the second surface and a distal end terminating within the body, the second portion of the body defined by the area between the first surface and the distal end of the passages, the first portion being translucent to infrared radiation.

22. The window of claim 21 wherein the first portion comprises quartz.

\* \* \* \* \*